US007703413B2

(12) United States Patent
Miebach et al.

(10) Patent No.: US 7,703,413 B2
(45) Date of Patent: Apr. 27, 2010

(54) EXPANDED THERMAL PLASMA APPARATUS

(75) Inventors: Thomas Miebach, Ballston Spa, NY (US); Charles Dominic Iacovangelo, Clifton Park, NY (US); William Arthur Morrison, Albany, NY (US)

(73) Assignee: Sabic Innovative Plastics IP B.V. (NL)

( * ) Notice: Subject to any disclaimer, the term of this patent is extended or adjusted under 35 U.S.C. 154(b) by 438 days.

(21) Appl. No.: 10/881,949

(22) Filed: Jun. 28, 2004

(65) Prior Publication Data

US 2005/0284374 A1 Dec. 29, 2005

(51) Int. Cl.
*C23C 16/00* (2006.01)
*C23F 1/00* (2006.01)
*H01L 21/306* (2006.01)

(52) U.S. Cl. .............................. 118/723 E; 156/345.43

(58) Field of Classification Search ................ 118/715, 118/722 R, 723 VE, 723 CB, 723 EB, 723 MP, 118/723 HC, 723 DC See application file for complete search history.

(56) References Cited

U.S. PATENT DOCUMENTS 4,035,684 A 7/1977 Svoboda
4,871,580 A 10/1989 Schram et al.
5,227,603 A * 7/1993 Doolette et al. ........ 219/121.59
5,620,616 A * 4/1997 Anderson et al. ...... 219/121.52
6,261,694 B1 7/2001 Iacovangelo
6,397,776 B1 6/2002 Yang et al.
2003/0049468 A1* 3/2003 Hu et al. .................... 428/451
2004/0040833 A1 3/2004 Schaepkens et al.
2004/0188019 A1* 9/2004 Lopes Cardozo et al. .................... 156/345.43

FOREIGN PATENT DOCUMENTS

EP 249238 12/1987

* cited by examiner

*Primary Examiner*—Parviz Hassanzadeh
*Assistant Examiner*—Maureen Gramaglia
(74) *Attorney, Agent, or Firm*—Brinks Hofer Gilson & Lione

(57) ABSTRACT

Disclosed herein is an assembly for plasma generation comprising a cathode plate comprising a fixed cathode tip, the cathode tip being integral part of the cathode plate. The assembly further comprises at least one cascade plate, at least one separator plate disposed between the cathode plate and the cascade plate, an anode plate, and an inlet for a gas. The cathode plate, separator plate, cascade plate and anode plate are "electrically isolated" from one another, and the electrically isolated cathode plate, separator plate, and cascade plate define a plasma generation chamber. The cathode tip is disposed within the plasma generation chamber.

26 Claims, 5 Drawing Sheets

EXPANDED THERMAL PLASMA APPARATUS

BACKGROUND OF THE INVENTION

This invention relates to an apparatus for generating a consistent and stable plasma. More particularly, it relates to an assembly (this assembly is also referred to as an "arc") for generating a consistent and stable expanding thermal plasma (hereinafter referred to as "ETP"), which assembly is easy to maintain and operate.

Known methods for depositing an adherent coating onto a surface of a substrate by plasma deposition typically comprise passing a plasma gas through a direct current arc plasma generator to form a plasma. A substrate is positioned in an adjoining vacuum chamber (The vacuum chamber is also referred to as the "deposition chamber"). The plasma is expanded into the vacuum chamber towards the substrate. A reactant gas and an oxidant are injected downstream into the expanding plasma. Reactive species formed in the plasma from the oxidant and/or reactant gas contact the surface of the substrate for a period of time sufficient to form an adherent coating.

Plasma sources are used to provide a variety of surface treatments for a number of articles. Examples of such surface treatments include deposition of various coatings, plasma etching, and plasma activation of the surface. An array of multiple plasma sources may be used to coat or treat larger substrate areas. The characteristics of the plasma process are strongly affected by the operating parameters of these plasma sources.

Operating parameters typically used for the current arc design are the flow rate and pressure of the plasma gas, the electrical current applied to the arc and the voltage between cathode and anode. These operating parameters together with the arc geometry and design influence the degree of ionization of the plasma gas and hence surface properties and coating performance of parts coated in a plasma deposition process. In a typical plasma deposition process the gas flow rate and the arc current are controlled and result in control of the operating pressure and voltage.

During plasma treatment, conditions and geometry within the plasma source may drift, i.e. cathode voltage or operating pressure may change without changes in the current or gas flow. These changes can be attributed to a variety of causes within the plasma source. Sources of variability include changes brought about as a result of the erosion of the cathode. Other plasma source components subject to erosion include the cascade plate and the separator plate. During the operation of the plasma source copper can erode from the cascade plate and re-deposit across the insulator leading to reduced resistance between the two isolated plates and ultimately to shorting. Yet another cause leading to resistance changes or shorting of the arc is the presence of water between the electrically isolated plates, e.g. by a failure to exclude water from the environment or by leakage of coolant water into the interior of the plasma source. To counteract such drift, particularly the permanent changes caused by erosion of plasma source components, disruption of the plasma deposition process and disassembly of the plasma source are usually required.

An array of multiple plasma sources may at times be used to coat larger substrate areas. Ideally, the individual plasmas generated by each of the plasma sources in the array should have the same characteristics. In practice, however, source-to-source variation in plasma characteristics is frequently observed. Consequently, articles coated in a plasma deposition device comprising multiple plasma sources can demonstrate undesirable variability in surface coating properties at different locations on the coated substrate surface. Thus there is a need to reduce variability among multiple plasma sources in multi-source plasma deposition devices.

The plasma sources employed in plasma deposition devices have finite lifetimes and must be serviced or replaced periodically. Among typical plasma deposition devices, in order to service (i.e. repair or replace) the plasma source, the plasma deposition chamber must be vented to the atmosphere. Venting the plasma deposition chamber to the atmosphere requires that the plasma deposition process be shut down. This results in downtime and production losses. Furthermore the plasma source design typically comprises a variety of different components, which have to be machined to different tolerances. Thus, in some instances downtime for servicing the plasma source increases due to lack of availability of a component needed as a replacement part.

Typically, drift within a single plasma source cannot be corrected for in real time because such corrections require disruption of the process and disassembly of the plasma source. Where multiple plasma sources are used, minimization of source-to-source variation in the generated plasmas is often desirable. Therefore, what is needed is a simplified apparatus for the generation of a plasma, which apparatus is capable of generating a consistent and stable plasma, is easily serviceable, and which apparatus provides for greater efficiency in plasma mediated surface treatment processes, said efficiency being due in part to a reduction in apparatus downtime during servicing.

BRIEF DESCRIPTION OF THE INVENTION

In one aspect the present invention relates to an assembly for plasma generation comprising:

(a) a cathode plate comprising a fixed cathode tip, said cathode tip being integral part of said cathode plate;

(b) at least one cascade plate;

(c) at least one separator plate disposed between said cathode plate and said cascade plate;

(d) an anode plate; and (e) an inlet for a gas;

wherein said cathode plate, separator plate, cascade plate and anode plate are "electrically isolated" from one another, and wherein said electrically isolated cathode plate, separator plate, and cascade plate define a plasma generation chamber, said cathode tip being disposed within said plasma generation chamber.

In another aspect the present invention relates to a deposition apparatus for surface treating of a substrate, the deposition apparatus comprising:

(1) a deposition chamber; and (2) at least one assembly for plasma generation comprising;

- (a) a cathode plate comprising a fixed cathode tip said cathode tip being integral part of said cathode plate;
- (b) at least one cascade plate;
- (c) at least one separator plate disposed between said cathode plate and said cascade plate;
- (d) an anode plate; and
- (e) an inlet for a gas;

wherein said cathode plate, separator plate, cascade plate and anode are "electrically isolated" from one another, and wherein said electrically isolated cathode plate, separator plate, and cascade plate define a plasma generation chamber, said cathode tip being disposed within said plasma generation chamber.

In yet another aspect the present invention relates to an assembly for plasma generation, said assembly comprising:

(a) a retrofittable sub-assembly comprising at least one cathode, at least one cascade plate and at least one of either a separator plate or cathode housing, said separator plate or cathode housing being disposed between said cathode plate and said cascade plate;

(b) an anode plate; and (c) an inlet for a gas;

wherein said cathode, separator plate or cathode housing, cascade plate and anode plate are electrically isolated from one another, and wherein said electrically isolated catode plate, separator plate or cathode housing, and cascade plate define a plasma generation chamber, said cathode being disposed within said plasma generation chamber.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Various embodiments of this invention have been described in fulfillment of the various needs that the invention meets. It should be recognized that these embodiments are merely illustrative of the principles of various embodiments of the present invention. Numerous modifications and adaptations thereof will be apparent to those skilled in the art without departing from the spirit and scope of the present invention. Thus, it is intended that the present invention cover all suitable modifications and variations as come within the scope of the appended claims and their equivalents.

Figure 1:
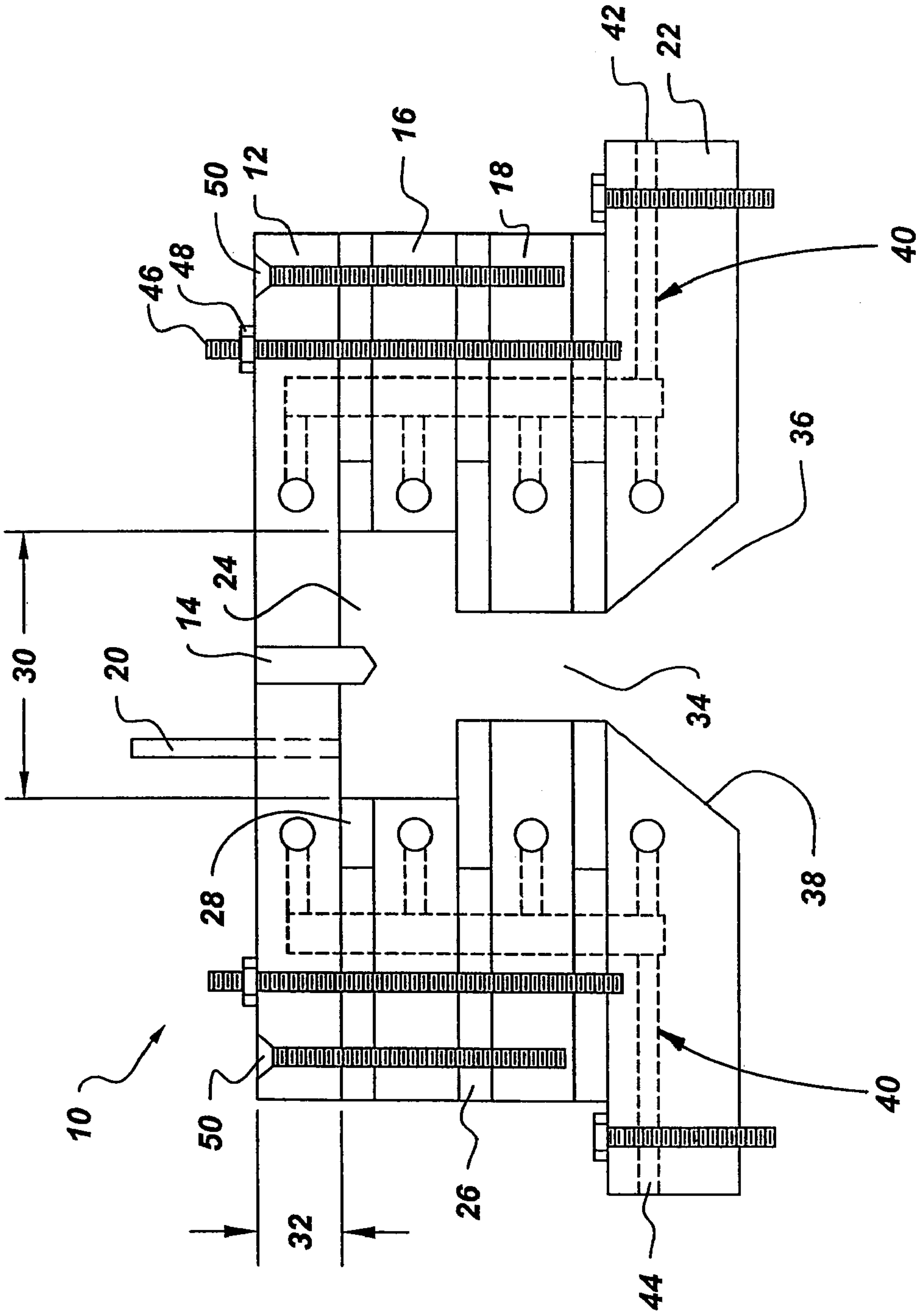
FIG. 1 is a schematic cross-sectional view of an exemplary assembly for plasma generation.

Disclosed herein is an assembly for generating a consistent and stable plasma for surface treatment. FIG. 1 is a schematic, cross-sectional view of an exemplary assembly 10 for plasma generation. The assembly 10 comprises a cathode plate 12 comprising a fixed cathode tip 14, at least one cascade plate 18 and at least one separator plate 16 disposed between the cathode plate 12 and the cascade plate 18. The cathode tip 14 is an integral part of the cathode plate 12. By "integral part" it is meant that the tip is fixed, not adjustable and permanently bonded by known means, e.g. welding, brazing, soldering, etc. The assembly 10 further comprises an anode plate 22 and an inlet 20 for a gas. The cathode plate 12, the cascade plate 18, the separator plate 16 and the anode plate 22 are electrically isolated from one another. The electrically isolated cathode plate 12, separator plate 16 and cascade plate 18 define a plasma generation chamber 24. In the exemplary embodiment, as shown in FIG. 1, the cathode tip 14 is disposed within the plasma generation chamber 24.

The diameter of the plasma generation chamber 24 is determined by the diameter 30 of the opening at the center of the separator plate 16. In some embodiments, the cathode plate 12, the separator plate 16 and the cascade plate 18 are machined from identical blank plates, so that the thicknesses 32 of all the plates are identical.

The cascade plate 18 further comprises an opening 34 at the center of the plate. The diameter of the opening 34 is substantially smaller than the diameter 30 of the opening in the separator plate 16. Therefore the opening 34 acts as an orifice and restricts the flow of plasma from the plasma generation chamber 24, thereby increasing the pressure in the plasma generation chamber 24. The anode plate 22 is disposed adjacent to the cascade plate 18, which cascade plate 18 is electrically isolated from the anode plate 22 as described above. The anode plate 22 is configured to have a expanded opening 36 aligned at the center of the anode plate 22, wherein the cross section of the opening 36 expands along with the inside surface 38. The anode plate 22 is disposed on a deposition chamber (not shown) by means of fastening bolts 50. In the exemplary embodiment, as shown in FIG. 1, the cathode tip 14 is disposed within the plasma generation chamber 24.

All assembly components, cathode plate 12, separator plate 16, cascade plate 18 and anode plate 22 are electrically isolated. Typically O-rings, spacers (of PVC for example) and central rings made of boron nitride may be employed to seal and isolate the individual components. Any material or combination of materials that serve the purpose of achieving electrical isolations and provide a vacuum seal can be used. In one embodiment, a Viton® gasket 26 together with a central ring made from boron nitride is used to electrically isolate the individual components as well as provide a vacuum seal and water seal to prevent shorting due to moisture. In order to prevent shorting resulting from erosion of the metallic components of the assembly and re-deposition of the eroded metal (e.g. copper metal) in the cascade plate to anode gap, the thickness of the gasket is configured to be larger than the boron nitride central disk. In the case of o-rings and spacers, this can be achieved by increasing the thickness of the o-ring and spacer relative to the central ring. The metal rods 46 used to fasten the components must also be electrically isolated. This can be achieved by using an insulating sleeve, or the rods themselves can be made from an electrically non-conductive material, e.g. a threaded rod made from Garolite® G10.

In a plasma generation process, the temperature of the assembly for plasma generation may be in the range of about 1000 K to about 10,000 K. For an efficient plasma generation process the elements in the plasma generation assembly need to be cooled. The cathode plate 12, separator plate 16 and the cascade plate 18 comprise an electrically and thermally conducting metal, including but not limited to copper (Cu). Any other metal that meets these requirements may also be used, e.g. stainless steel, nickel, nichrome, etc.

The cooling of the cathode plate 12, separator plate 16, cascade plate 18 and the anode plate 22 may be achieved by passing a cooling medium through the different plates to achieve proper cooling. Each plate may have an individual cooling circuit including an inlet and outlet for the cooling medium. In one embodiment of the present invention the assembly for plasma generation comprises a single circuit 40, which circuit comprises at least one cooling medium inlet 42 and one cooling medium outlet 44. Using an identical blank plate for making each of the cathode plate 12, separator plate 16 and the cascade plate 18, the single circuit 40 for the cooling medium may be formed as described in the following sections. In one embodiment, water is used as the cooling medium to cool the assembly for plasma generation. Any other cooling medium that is compatible with the materials of construction of the assembly for plasma generation may also be used.

Referring to FIG. 1, a gas for generating the plasma (hereinafter referred to as a "plasma gas") is injected into plasma chamber 24 through at least one plasma gas inlet 20. The plasma gas may comprise at least one inert or non-reactive gas, such as, but not limited to, a noble gas (i.e., He, Ne, Ar, Xe, Kr). Alternatively, in embodiments where the plasma is used to etch the surface, the plasma gas may comprise a reactive gas, such as, but not limited to, hydrogen, nitrogen, oxygen, fluorine, or chlorine. In one embodiment the reactive gas is fed downstream from the anode. Flow of the plasma gas may be controlled by a flow controller (not shown), such as a mass flow controller, located between a plasma gas generator (not shown) and the at least one plasma gas inlet 20. A plasma is generated within plasma chamber 24 by injecting the plasma gas into the plasma chamber 24 through at least one plasma gas inlet 20 and striking an arc between the cathode tip 14 and the anode plate 22. The voltage needed to strike an arc between the cathode tip 14 and the anode plate 22 is provided by power source (not shown).

Figure 2:
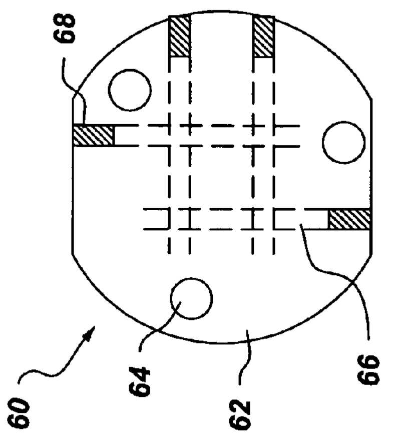
FIG. 2 is a schematic top view of an exemplary blank plate used to make the elements of an assembly for plasma generation.

FIG. 2 illustrates a top view 60 of an exemplary blank plate 62. The use of a standardized "blank plate" as a starting point to make three components of the assembly for plasma generation (cathode plate, separator plate and cascade plate) reduces the need to stock replacement parts. From this "blank" 62, each component is easily machined by drilling the appropriate holes for water lines and plasma orifices. The fixed position of the cathode tip, which can be well aligned with the central axis of the assembly, also reduces the variation from one assembly to another. Furthermore, the thickness of the cathode plate, separator plate and the cascade plate is essentially equal as the plates are all made from identical blank plates 62. The shape of the exemplary blank plate 62, as shown in FIG. 2, is non-limiting. In one embodiment, the cathode plate, the separator place and the cascade plate are made out of the blank plate 62 as shown in FIG. 2. The blank plate 62 comprises a set of 3 holes 64, which holes are provided for fixing the individual plates or Sub-assembly to the anode plate, which is fixed to the main structure of the plasma deposition chamber. The blank plate 62 is configured to have one or more water channels 66 to provide the cooling water circulation within the plate. In the blank plate, the water channels are plugged by a plurality of plugs 68. The water channels are drilled within the blank plate 62 in such a way that the heat transfer from the plate to the cooling medium (e.g. water) is efficient. The design shown in FIG. 2 and elsewhere in the disclosure of the water channels 66 in the blank plate 62 will be recognized by those skilled in the art as a non-limiting example and many other different designs may be used in order to achieve efficient heat transfer between the plate and the cooling medium.

Figure 3:
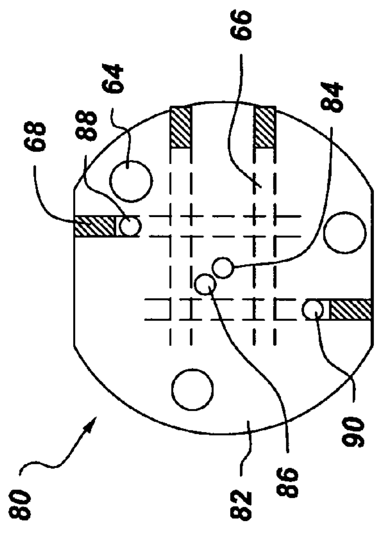
FIG. 3 is a schematic top view of an exemplary cathode plate of an assembly for plasma generation.

FIG. 3 illustrates a top view 80 of an exemplary cathode plate 82 made from the blank plate 62 as shown in FIG. 2. The shape and size of the cathode plate 82 is identical to that of the blank plate 62. The cathode plate also comprises a set of 3 holes 64 in the same position as shown in the bank plate 62. The water channels 66 are disposed in the same position as shown in the blank 62 and the water channels are plugged by a plurality of plugs 68. The cathode plate comprises an opening 84 to hold the cathode. In one embodiment, this opening 84 is aligned at the center of the cathode plate 82. The cathode plate 82 further comprises yet another opening 86 to allow the gas to enter the plasma generation chamber. The holes 88 and 90 communicate with the water channels 66 and serve as a water inlet and a water outlet for the cathode plate during plasma generation.

Figure 4:
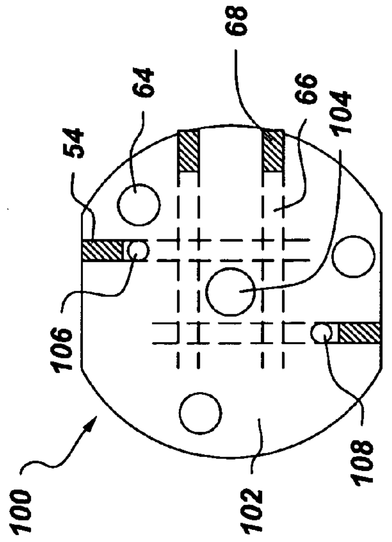
FIG. 4 is a schematic top view of an exemplary separator plate of an assembly for plasma generation.

FIG. 4 illustrates a top view 100 of an exemplary separator plate 102 made from the blank plate 62 shown in FIG. 2. The shape and size of the separator plate 102 is identical to that of the blank plate 62. The separator plate 102 also comprises a set of 3 holes 64 in the same position as shown in the bank plate 62. The water channels 66 are disposed in the same position as shown in the blank 62 and the water channels are plugged by a plurality of plugs 68 and 54. The separator plate 102 further comprises an opening 104, the diameter of this opening defines the diameter of the plasma generation chamber. This opening 104 is aligned at the center of the separator plate 102. The holes 106 and 108 communicate with the water channels 66 and serve as a water inlet and a water outlet from the separator plate 102 during operation. The holes 106 and 108 may be exactly aligned with the corresponding water inlet and water outlet holes (88 and 90) in the cathode plate 82.

Figure 5:
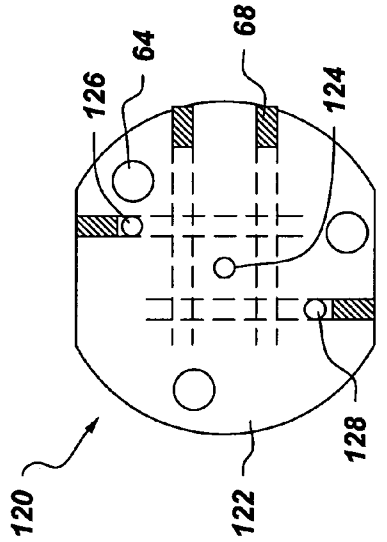
FIG. 5 is a schematic top view of an exemplary cascade plate of an assembly for plasma generation.

FIG. 5 illustrates a top view 120 of an exemplary cascade plate 122 made from the blank plate 62 shown in FIG. 2. The shape and size of the separator plate 122 is identical to that of the blank plate 62. The cathode plate also comprises a set of 3 holes 64 in the same position as shown in the bank plate 62. The water channels 66 are disposed in the same position as shown in the blank 62 and the water channels are plugged by a plurality of plugs 68. The cascade plate 122 further comprises an opening 124, the diameter of which opening 124 defines the diameter of the orifice restricting the flow of the plasma from the plasma generation chamber to the plasma deposition chamber. In one embodiment, this opening 124 is aligned at the center of the separator plate 122. The holes 126 and 128 communicate with the water channels 66 and serve as a water inlet and a water outlet from the cascade plate cascade plate 122 during operation. The holes 126 and 128 may be exactly aligned with the corresponding holes in the cathode plate 82 and the separator plate 102. Therefore, once the cathode plate 82, separator plate 102 and the cascade plate 122 are assembled, a single water circuit 40 (as in FIG. 1) may be formed.

Figure 6:
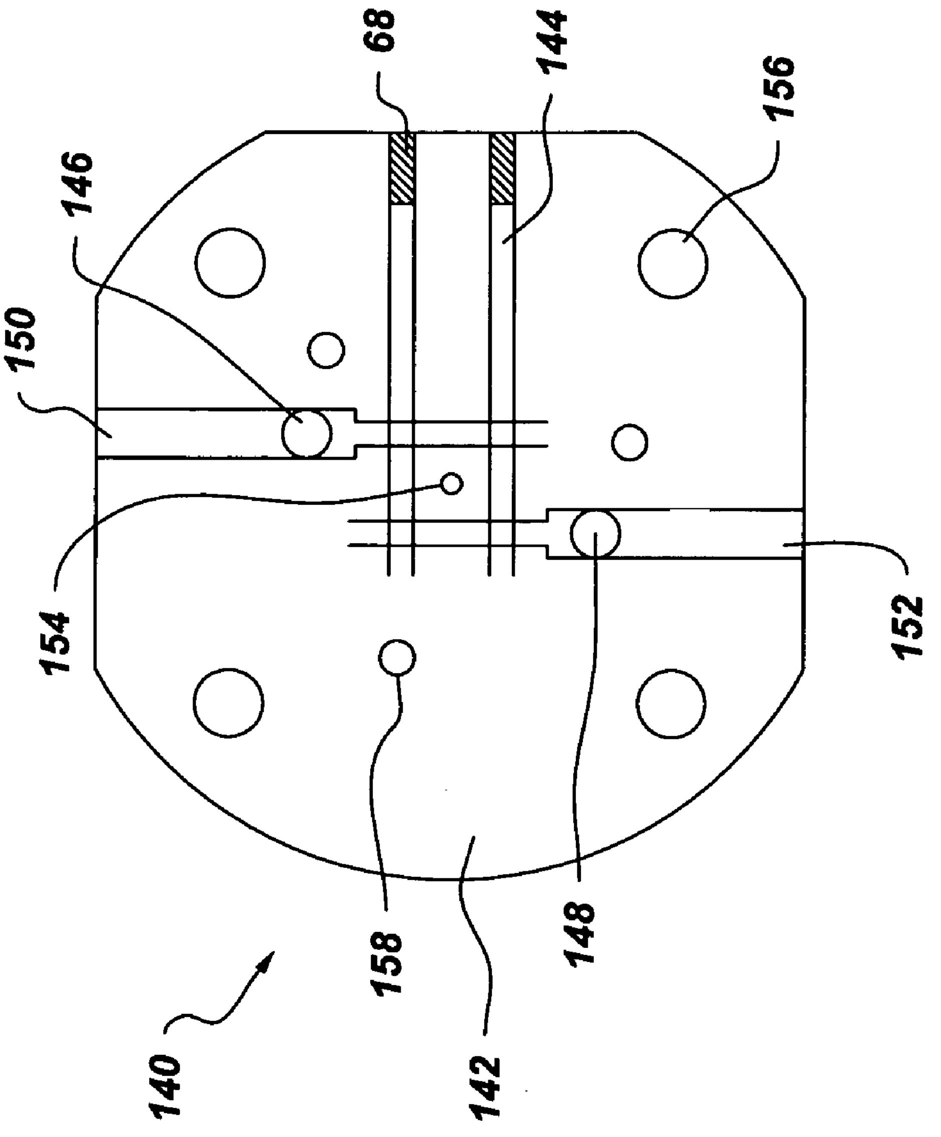
FIG. 6 is a schematic top view of an exemplary anode plate of an assembly for plasma generation.

FIG. 6 illustrates a top view 140 of an exemplary anode plate 142. Internal water channels 144 are provided for cooling of the anode plate 142. The water channels are configured within the anode plate 142 in such a way that the heat transfer from the plate to the cooling medium such as water passing through the channels is efficient. Those skilled in the art will appreciate that the design shown in FIG. 6 of the water channels 144 in the anode plate 142 is a non-limiting example and that many other different designs may be used to achieve efficient heat transfer between the plate and the cooling medium. The holes 146 and 148 communicate with the water channels 144 and also communicate with the internal water circuit 40 (See FIG. 1). The holes 146 and 148 may be exactly aligned with the corresponding holes in the cathode plate 82, the separator plate 102 and the cascade plate 122. Therefore, once the cathode plate 82, separator plate 102, cascade plate 122 and the anode plate 142 are assembled, a single water circuit 40 (as shown in FIG. 1) may be formed. One or more each of the drilled water channels are used as the water inlet 150 and outlet 152 (corresponding to 42 and 44 in FIG. 1), the other water channels are closed by a plurality of plugs 68. The anode plate 142 is configured to have a expanded opening aligned at the center of the anode plate 142. The smaller diameter hole 154 of this expanding opening is matched in size to the opening 34 in the assembly shown in FIG. 1. Four holes 156 are provided to dispose the anode plate on a deposition chamber (not shown) by means of fastening bolts 46 (as in FIG. 1). The three holes 158 line up with the corresponding holes 64 (See FIGS. 3, 4, and 5) of a Sub-assembly consisting of the cathode plate, the separator plate and the cascade plate and create a channel to fasten the Sub-assembly to the anode plate by means of threaded rods 46 and fastening nuts 48 as in FIG. 1.

Figure 7:
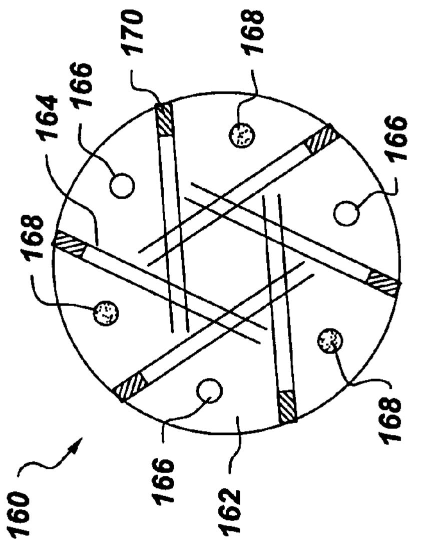
FIG. 7 is a schematic top view of yet another exemplary blank plate used to make the elements of an assembly for plasma generation.

FIG. 7 illustrates a top view 160 of another exemplary blank plate 162. In one embodiment the present invention provides an assembly for plasma generation in which the cathode plate, the separator plate and the cascade plate are made out of the blank plate 162 shown in FIG. 7. The blank plate 162 comprises a "six-fold symmetric" water channel design and two sets of 3 holes drilled through the blank plate 162. The six-fold symmetric water channel design comprises six identical water channels 164 configured as shown. The first set of holes 166 is configured to permit attachment of the cathode plate to separator plate and the separator plate to the cascade plate to create a Sub-assembly comprising the cathode plate, the separator plate and cascade plate. This Sub-assembly can then be attached by independent means to the anode plate using the second set of through holes 168. The water channels 164 are plugged with a plurality of plugs 170.

Figure 8:
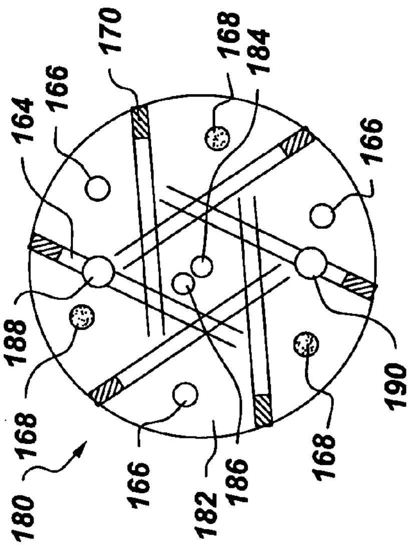
FIG. 8 is a schematic top view of yet another exemplary cathode plate of an assembly for plasma generation.

FIG. 8 illustrates a top view 180 of an exemplary cathode plate 182 made from the blank plate 162 shown in FIG. 7. The shape and size of the cathode plate 182 is identical to that of the blank plate 162. The cathode plate 182 also comprises 2 sets of 3 holes, 166 and 168 in the same position as shown in the bank plate 162. The water channels 164 are disposed in the same position as shown in the blank 162 and the water channels are plugged by a plurality of plugs 170. The cathode plate 182 comprises an opening 184 to hold the cathode. In one embodiment, this opening 184 is aligned at the center of the cathode plate 182. The cathode plate 182 further comprises yet another opening 186 to allow the gas to enter the plasma generation chamber. The holes 188 and 190 drilled into the water channels 164 are used for water inlet and water outlet for the cathode plate during plasma generation.

Figure 9:
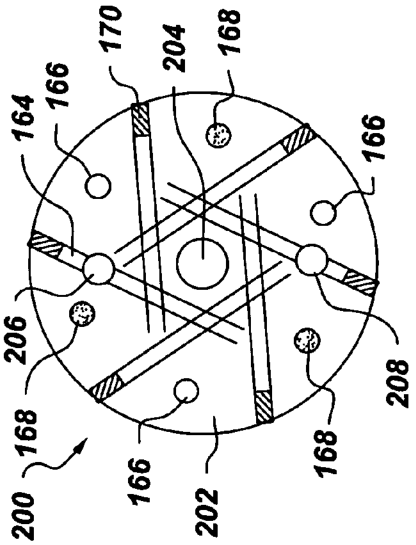
FIG. 9 is a schematic top view of yet another exemplary separator plate of an assembly for plasma generation.

FIG. 9 illustrates a top view 200 of an exemplary separator plate 202 made from the blank plate 162 shown in FIG. 7. The shape and size of the separator plate 202 is identical to that of the blank plate 162. The separator plate 202 also comprises 2 sets of 3 holes, 166 and 168 in the same position as shown in the bank plate 162. The water channels 164 are disposed in the same position as shown in the blank 162 and the water channels are plugged by a plurality of plugs 170. The separator plate 202 further comprises an opening 204, the diameter of which opening 204 defines the diameter of the plasma generation chamber. This opening 204 is aligned at the center of the separator plate 202. The holes 206 and 208 drilled into the water channels 164 are used for water inlet and water outlet for the separator plate during plasma generation. These holes may be exactly aligned with the corresponding water inlet and water outlet holes in the cathode plate 182.

Figure 10:
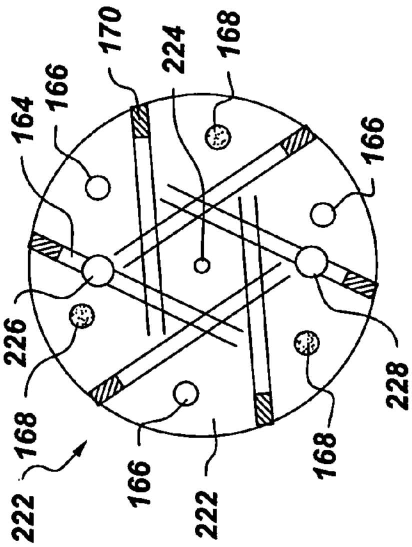
FIG. 10 is a schematic top view of yet another exemplary cascade plate of an assembly for plasma generation.

FIG. 10 illustrates a top view 220 of an exemplary cascade plate 222 made from the blank plate 162 shown in FIG. 7. The shape and size of the cascade plate 222 is identical to that of the blank plate 162. The cascade plate 222 also comprises 2 sets of 3 holes, 166 and 168 in the same position as shown in the bank plate 162. The water channels 164 are disposed in the same position as shown in the blank 162 and the water channels are plugged by a plurality of plugs 170. The cascade plate 222 further comprises an opening 224, the diameter of which opening 224 defines the diameter of the orifice restricting the flow of plasma from the plasma generation chamber to the deposition chamber. This opening 224 is aligned at the center of the separator plate. The holes 226 and 228 drilled into the water channels 164 are used for water inlet and water outlet for the cathode plate during plasma generation. These holes may be exactly aligned with the corresponding water inlet and water outlet holes in the cathode plate 182 and separator plate 202. Therefore, once the cathode plate 182, separator plate 202 and the cascade plate 222 are assembled, a single water circuit may be formed.

The use of a standardized "blank plate" as a starting point to make each of the three components (cathode plate, separator plate and cascade plate) of the sub-assembly for the plasma generation assembly reduces the burden of keeping customized replacement parts in stock. From a common blank, each component of the sub-assembly is easily machined by drilling additional holes required (e.g. holes for water lines and holes for plasma orifices). Because of fewer components required in stock, easier machinability, and standardized internal water channels, the use of standardized blank plates to prepare individual sub-assembly components reduces the cost and downtime, and simplifies maintenance of the overall plasma generation and surface treatment process. Additionally, the use of a "blank plate" as a starting element for the preparation of sub-assembly components, and the fixed cathode design of the present invention allow for reduced variability of the overall plasma generation and surface treatment process.

As disclosed in the preceding sections, the assembly for plasma generation comprises a sub-assembly comprising the cathode plate, the separator plate and the cascade plate as components of the sub-assembly which may be joined together with an electrically non-conductive fastener 50 (FIG. 1). Those skilled in the art will recognize that in certain aspects the present invention includes the use of elements of known plasma source designs, such as those described in US Patent Application No. 2004/0040833 ("tunable design"), and co-pending application Ser. No. 10/655,350 filed Sep. 9, 2003 ("adjustable design") to create the novel retrofitable sub-assemblies which form one aspect of the instant invention.

In the assembly for plasma generation as disclosed in the preceding sections, the cathode plate, the separator plate and the cascade plate form a sub-assembly. The sub-assemblies described in the embodiments described herein are "retrofitable" onto the assembly for plasma generation shown in FIG. 1. The sub-assembly components are connected to one another and to the assemble by means of an electrically non-conductive fastener 50. In operation, if any one or more of the components of the sub-assembly, such as the cathode plate, separator plate or the cascade plate develops any fault, a new sub-assembly can be retrofitted onto the assembly without opening the connection between the anode plate and the plasma deposition chamber. Since the connection to the plasma deposition chamber is not disturbed, during the replacement of the sub-assembly, the vacuum in the deposition chamber may be maintained at low level during the replacement process. In one embodiment the vacuum level in the deposition chamber is maintained at about 1 torr or less during removal and replacement of the sub-assembly. In this specification, "retrofitable" means that the sub-assembly can be removed and replaced with another sub-assembly without substantial permanent supporting structural alteration. For example, the sub-assembly is "retrofitable" if it can be removed and replaced by loosening nuts and withdrawing rods through the sub-assembly. Further, the single water circuit used for flowing the cooling water through the cathode plate, separator plate and the cascade plate in the sub-assembly makes the servicing of the Sub-assembly a faster process.

Figure 11:
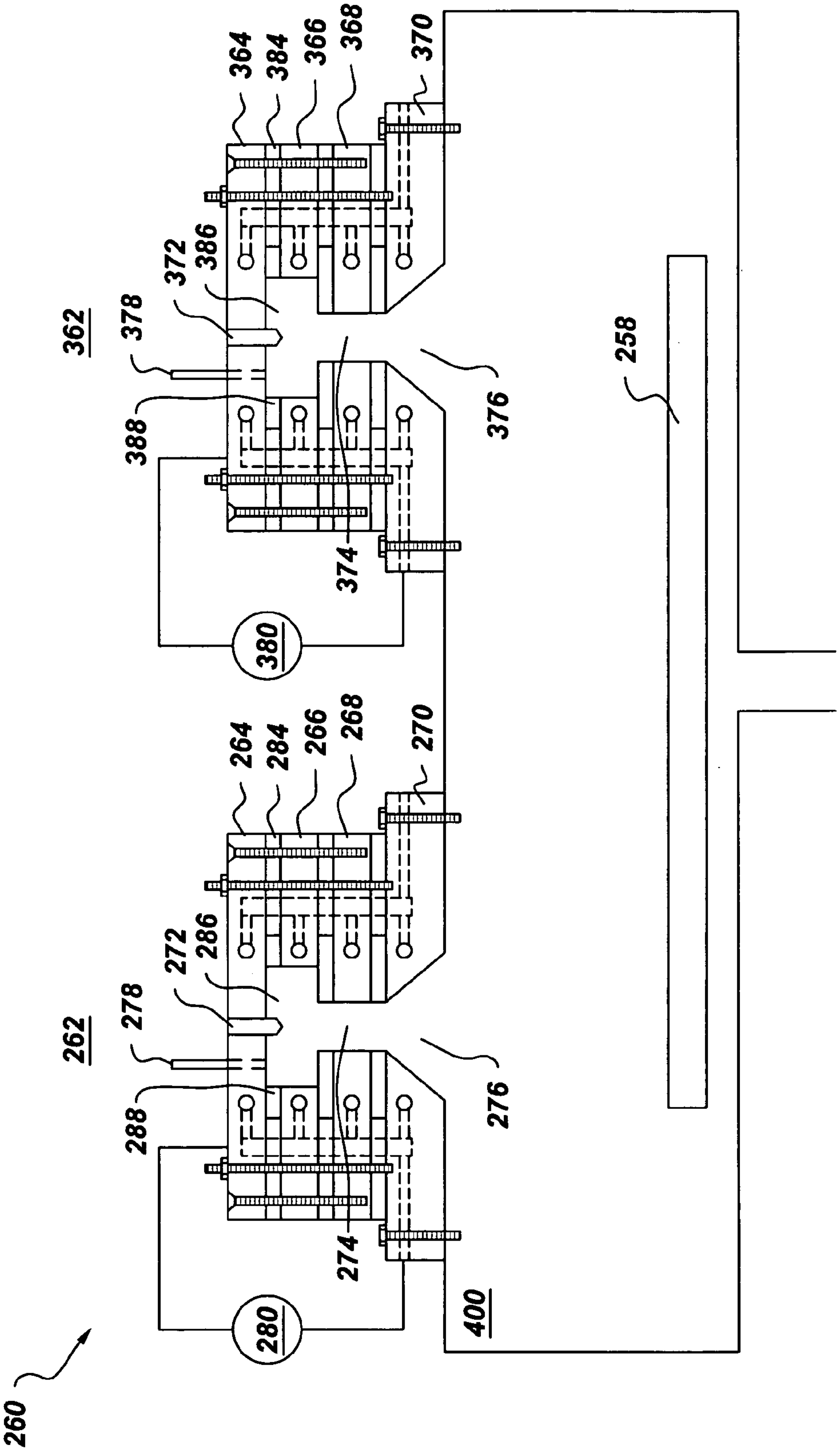
FIG. 11 is a schematic representation of a deposition apparatus for plasma generation and surface treatment.

A plasma deposition apparatus generally includes a plasma source comprising a plasma generation chamber as described in the preceding sections. FIG. 11 discloses an exemplary plasma deposition apparatus 260. The plasma deposition apparatus 260 comprises a first assembly 262 and a second assembly 362 for plasma generation and a plasma deposition chamber 400. The configuration of the deposition apparatus is not limited to the embodiment represented in the FIG. 11, but may comprise a single assembly for plasma generation or more than two assemblies for plasma generation as well. It is understood that, while various features of the first assembly 262 are described in detail and are referred to throughout the following description, the following description is also applicable to second assembly 362 as well.

The first assembly 262 comprises a cathode plate 264 comprising a fixed cathode tip 272, at least one cascade plate 268 and at least one separator plate 266 disposed between the cathode plate 264 and the cascade plate 268. The cathode tip 272 is an integral part of the cathode plate 264. The first assembly 262 further comprises an anode plate 270 and an inlet 278 for a gas. In one embodiment, the cathode plate 264, the cascade plate 268, the separator plate 266 and the anode plate 270 are electrically isolated from one another by a Viton® gasket 284 and a boron nitride disk 288. The electrically isolated cathode plate 264, separator plate 266 and cascade plate 268 define a plasma generation chamber 286. In the exemplary embodiment, as shown in FIG. 11, the cathode tip 272 is disposed within the plasma generation chamber 286. An exit port 276 provides fluid communication between the plasma generation chamber 286 and a deposition chamber 400. The plasma generated within the plasma generation chamber 286 exits plasma chamber 286 through exit port 276 and enters the deposition chamber 400. In one embodiment, exit port 276 may comprise an orifice formed in anode 270. As disclosed in the preceding sections, in some embodiments, the cathode plate 264, the separator plate 266 and the cascade plate 268 are made from identical blank plates, so that the thicknesses of all the plates are identical.

In one embodiment, a power source 280 is connected to the first assembly 262. The power source 280 is an adjustable DC power source that provides the required current and voltage for igniting and maintaining the arc power. The deposition chamber 400 is maintained at a pressure, which is substantially less than the pressure in the first assembly 262 by means of vacuum pumps not shown. In one embodiment, the deposition chamber 400 is maintained at a pressure of less than about 1 torr (about 133 Pa) and, specifically, at a pressure of less than about 100 millitorr (about 0.133 Pa), while the plasma generation chamber 286 is maintained at a pressure of at least about 0.1 atmosphere (about $1.01\times10^4$ Pa). As a result of the difference between the pressure in the plasma generation chamber 286 and the pressure in the deposition chamber 400, the plasma generated in the first assembly 262 passes through the exit port 276 and expands into the deposition chamber 400.

Deposition chamber 400 is adapted to contain an article 258 that is to be treated with the plasmas produced by the deposition apparatus 260. In one embodiment, such plasma treatment of article 258 comprises injecting at least one reactive gas into the plasma produced by apparatus 260 and depositing at least one coating on a surface of article 258. The surface of article 258 upon which the plasma impinges may be either planar or non-planar. Apparatus 260 is capable of providing other plasma treatments in which at least one plasma impinges upon a surface of an article 258. Other plasma treatments include but are not limited to plasma etching at least one surface of article 258, heating article 258, lighting or illuminating article 258, and functionalizing (i.e., producing reactive chemical species) a surface of article 258.

The second assembly 362 comprises a cathode plate 364 comprising a fixed cathode tip 372, at least one cascade plate 368 and at least one separator plate 366 disposed between the cathode plate 364 and the cascade plate 368. The cathode tip 372 is an integral part of the cathode plate 364. The second assembly 362 further comprises an anode plate 370 and an inlet 378 for a gas. In one embodiment, the cathode plate 364, the cascade plate 368, the separator plate 366 and the anode plate 370 are electrically isolated from one another by a Viton® gasket 384 and a boron nitride disk 388. The electrically isolated cathode plate 364, separator plate 366 and cascade plate 368 define a plasma generation chamber 386. In the exemplary embodiment, as shown in FIG. 11, the cathode tip 372 is disposed within the plasma generation chamber 386. An exit port 376 provides fluid communication between the plasma generation chamber 386 and a deposition chamber 400. The plasma generated within the plasma generation chamber 386 exits plasma chamber 386 through exit port 376 and enters the deposition chamber 400. In one embodiment, exit port 376 may comprise an orifice formed in anode 370. As disclosed in the preceding sections, in some embodiments, the cathode plate 364, the separator plate 366 and the cascade plate 368 are made from identical blank plates, so that the thicknesses of all the plates are identical.

In one embodiment, a power source 380 is connected to the first assembly 362. The power source 380 is an adjustable DC power source that provides the required current and voltage for igniting and maintaining the arc power. The deposition chamber 400 is maintained at a pressure, which is substantially less than the pressure in the first assembly 362 by means of vacuum pumps not shown. In one embodiment, the deposition chamber 400 is maintained at a pressure of less than about 1 torr (about 133 Pa) and, specifically, at a pressure of less than about 100 millitorr (about 0.133 Pa), while the plasma generation chamber 386 is maintained at a pressure of at least about 0.1 atmosphere (about $1.01\times10^4$ Pa). As a result of the difference between the pressure in the plasma generation chamber 386 and the pressure in the deposition chamber 400, the plasma generated in the first assembly 362 passes through the exit port 376 and expands into the deposition chamber 400.

The treated or coated substrate may be of any suitable material including metal, semiconductor, ceramic, glass or plastic. Plastics and other polymers are commercially available materials possessing physical and chemical properties that are useful in a wide variety of applications. For example, polycarbonates are a class of polymers, which, because of their excellent breakage resistance, have replaced glass in many products, such as automobile head-lamps, safety shields, eyewear, and windows. However, many polycarbonates also have properties, such as low abrasion resistance and susceptibility to degradation from exposure to ultraviolet (UV) light. Thus, untreated polycarbonates are not commonly used in applications such as automotive and other windows, which are exposed, to ultraviolet light and physical contact from a variety of sources. In one embodiment, the coated substrate 202 is a thermoplastic such as polycarbonate, copolyestercarbonate, polyethersulfone, polyetherimide or acrylic. The term "polycarbonate" in this context including homopolycarbonates, copolycarbonates and copolyestercarbonates.

Various embodiments of this invention have been described in fulfillment of the various needs that the invention meets. It should be recognized that these embodiments are merely illustrative of the principles of various embodiments of the present invention. Numerous modifications and adaptations thereof will be apparent to those skilled in the art without departing from the spirit and scope of the present invention. Thus, it is intended that the present invention cover all suitable modifications and variations as come within the scope of the appended claims and their equivalents.

What is claimed is:

1. An assembly for plasma generation comprising:

(a) a cathode plate comprising a fixed cathode tip, said cathode tip being an integral part of said cathode plate;

(b) at least one cascade plate;

(c) at least one separator plate disposed between said cathode plate and said cascade plate;

(d) an anode plate; and (e) an inlet for gas;

wherein the cathode plate, the at least one cascade plate, the at least one separator plate, and the anode plate each comprises internal cooling channels, wherein the internal cooling channels are connected to one another through coaxial bores defined in each of the cathode, cascade, separator and anode plates, wherein portions of the internal cooling channels define a plurality of loops for a cooling medium between at least one inlet and at least one outlet, one loop of said plurality of loops being located within each of the cathode plate, the separator plate, the cascade plate and the anode plate;

wherein said cathode plate, separator plate, cascade plate and anode plate define a stacked construction of plates upon one another and are "electrically isolated" from one another, and wherein said electrically isolated cathode plate, separator plate, and cascade plate define a plasma generation chamber, said cathode tip being disposed within said plasma generation chamber.

2. An assembly according to claim 1, wherein the electrical isolation is achieved through one of the techniques selected from the group consisting of an electrically insulating spacer, an O-ring, a gasket, a central ring made from boron nitride and combinations thereof.

3. An assembly according to claim 2, wherein the thickness of said spacer, O-ring or gasket, when present along with the central ring, is larger than said central ring.

4. An assembly according to claim 1, wherein said cathode plate, separator plate, and cascade plate are each characterized by a thickness being essentially equal.

5. An assembly according to claim 1, wherein said cathode plate, separator plate, and cascade plate each are made from a single sized blank plate.

6. An assembly according to claim 1, wherein said cathode plate, separator plate, and cascade plate comprise a conductive metal.

7. An assembly according to claim 1, wherein said cathode plate, separator plate, and cascade plate comprise copper (Cu).

8. An assembly according to claim 1, wherein said separator plate comprises an opening configured to have a diameter, said diameter defining diameter of said plasma generation chamber.

9. An assembly according to claim 1, wherein said cascade plate comprises a restriction passage for plasma flow, said restriction passage having a diameter smaller than said diameter of said plasma generation chamber.

10. An assembly according to claim 1, wherein said internal cooling channels form part of a single cooling circuit comprising at least one inlet and one outlet for a cooling medium.

11. An assembly according to claim 10, wherein said cooling medium is water.

12. An assembly according to claim 1, wherein said gas comprises argon.

13. A deposition apparatus for surface treating of a substrate comprising:

(a) a deposition chamber; and (b) at least one assembly for plasma generation comprising;

(c) a cathode plate comprising a fixed cathode tip, said cathode tip being an integral part of said cathode plate;

(d) at least one cascade plate;

(e) at least one separator plate disposed between said cathode plate and said cascade plate;

(f) an anode plate; and (g) an inlet for a gas; and (h) a cooling system, wherein the cooling system comprises internal cooling channels through each of the cathode plate, the at least one cascade plate, the at least one separator plate, and the anode plate, the internal cooling channels being connected to one another through coaxial bores defined in each of the anode, cascade, separator and cathode plates, wherein portions of the internal cooling channels define a plurality of loops for a cooling medium between at least one inlet and at least one outlet, one loop of said plurality of loops being located within each of the cathode plate, the separator plate, the cascade plate and the anode plate;

wherein said cathode plate, separator plate, cascade plate and anode define a stacked construction of plates upon one another and are "electrically isolated" from one another, and wherein said electrically isolated cathode plate, separator plate and cascade plate define a plasma generation chamber, said cathode tip being disposed within said plasma generation chamber.

14. The deposition apparatus according to claim 13, wherein the electrical isolation is achieved through one of the techniques selected from the group consisting of an electrically insulating spacer, an O-ring, a gasket, a central ring made from boron nitride, and combinations thereof.

15. The deposition apparatus according to claim 14, wherein the thickness of said spacer, O-ring or gasket, when present along with the central ring, is larger than said central ring.

16. The deposition apparatus according to claim 13, wherein said cathode plate, separator plate and cascade plate are each characterized by a thickness, said thicknesses being essentially equal.

17. The deposition apparatus according to claim 13, wherein said cathode plate, separator plate, and cascade plate each are made from a single sized blank plate.

18. The deposition apparatus according to claim 13, wherein said cathode plate, separator plate, and cascade plate comprise a conductive metal.

19. The deposition apparatus according to claim 13, wherein said cathode plate, separator plate, and cascade plate comprise copper (Cu).

20. The deposition apparatus according to claim 13, wherein said separator plate comprises an opening configured to have diameter, said diameter defining diameter of said plasma generation chamber.

21. The deposition apparatus according to claim 13, wherein said cascade plate comprises a restriction passage for plasma flow, said restriction passage having a diameter smaller than said diameter of said plasma generation chamber.

22. The deposition apparatus according to claim 13, wherein said cooling system comprises a single cooling circuit comprising at least one inlet and one outlet for a cooling medium.

23. The deposition apparatus according to claim 22, wherein said cooling medium is water.

24. The deposition apparatus according to claim 13, wherein said gas comprises argon.

25. The deposition apparatus according to claim 13, wherein said assembly for plasma generation comprises an inlet for a reactant fluid.

26. The deposition apparatus according to claim 13, further comprising an inlet for a reactant fluid downstream from the plasma generation assembly.

* * * * *